United States Patent
Jeong (10) Patent No.: US 9,020,004 B2
(45) Date of Patent: Apr. 28, 2015

(54) EXTERNAL RESONATOR-TYPE SEMICONDUCTOR LASER ELEMENT AND OPTICAL ELEMENT

(71) Applicant: Fujitsu Limited, Kawasaki-shi, Kanagawa (JP)

(72) Inventor: Seokhwan Jeong, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/154,279

(22) Filed: Jan. 14, 2014

(65) Prior Publication Data

US 2014/0126601 A1    May 8, 2014

Related U.S. Application Data

(63) Continuation of application No. PCT/JP2011/004526, filed on Aug. 10, 2011.

(51) Int. Cl.
| | |
|---|---|
| H01S 5/00 | (2006.01) |
| H01S 5/026 | (2006.01) |
| H01S 5/10 | (2006.01) |
| H01S 5/14 | (2006.01) |
| G02B 6/26 | (2006.01) |
| G02B 6/12 | (2006.01) |
| G02B 6/124 | (2006.01) |
| H01S 5/028 | (2006.01) |
| H01S 5/40 | (2006.01) |

(52) U.S. Cl.
CPC ............... *H01S 5/026* (2013.01); *H01S 5/1032* (2013.01); *H01S 5/1085* (2013.01); *H01S 5/142* (2013.01); *G02B 6/26* (2013.01); *H01S 5/0265* (2013.01); *H01S 5/0287* (2013.01); *H01S 5/4031* (2013.01); *G02B 6/12007* (2013.01); *G02B 6/124* (2013.01)

(58) Field of Classification Search
USPC ................... 372/43.01, 50.11, 64, 92, 94, 99
See application file for complete search history.

(56) References Cited

U.S. PATENT DOCUMENTS

| | | | |
|---|---|---|---|
| 2002/0076149 A1* | 6/2002 | Deacon .......................... | 385/27 |
| 2006/0198416 A1 | 9/2006 | Yamazaki | |
| 2008/0001062 A1* | 1/2008 | Gunn et al. ................... | 250/206 |
| 2009/0092159 A1 | 4/2009 | Kato | |
| 2009/0285251 A1 | 11/2009 | Yamazaki | |

FOREIGN PATENT DOCUMENTS

| | | |
|---|---|---|
| JP | 7-58388 | 3/1995 |
| JP | 2003-215515 | 7/2003 |
| JP | 2006-053436 | 2/2006 |
| JP | 2006-245344 | 9/2006 |
| JP | 2007-034202 | 2/2007 |

(Continued)

OTHER PUBLICATIONS

International Search Report, mailed in connection with PCT/JP2011/004526 and mailed Sep. 20, 2011, with partial English translation.

*Primary Examiner* — Dung Nguyen
(74) *Attorney, Agent, or Firm* — Fujitsu Patent Center (57) ABSTRACT

A ring resonator is connected to an optical amplifier. The ring resonator and optical amplifier are contained within the optical path of an optical resonator formed by a first and second reflector. The optical coupler branches part of the light conducting from the optical amplifier to the ring resonator within the optical resonator off to an output optical waveguide.

6 Claims, 11 Drawing Sheets

(56) References Cited

FOREIGN PATENT DOCUMENTS

| JP | 2009-010197 | 1/2009 |
|----|-------------|--------|
| JP | 2009-059729 | 3/2009 |
| JP | 2009-200091 | 9/2009 |
| JP | 2009-278015 | 11/2009 |
| JP | 2010-212472 | 9/2010 |

* cited by examiner

EXTERNAL RESONATOR-TYPE SEMICONDUCTOR LASER ELEMENT AND OPTICAL ELEMENT

CROSS REFERENCE TO RELATED APPLICATION

This application is a continuation application of International Patent application PCT/JP2011/004526, filed in Japan on Aug. 10, 2011, the whole contents of which are incorporated herein by reference.

FIELD

The embodiments discussed herein are related to an external resonator-type semiconductor laser element and an optical element used in the external resonator-type semiconductor laser element.

BACKGROUND

Amid advances in optical interconnect technology, hopes are pinned on the realization of an integrated optical input-output interface that is amenable to cost reduction. As a candidate technology capable of reducing the cost of an integrated optical input-output interface, attention is focused on silicon photonics. Since silicon is an indirect gap semiconductor, the luminous efficiency of a silicon-based light emitter is low compared to the luminous efficiency of a light emitter based on an InP compound semiconductor. Thus, a light emitter that uses silicon as its active material is not preferable in terms of luminous efficiency.

An external resonator-type semiconductor laser element that hybrid-integrates an InP-based high-efficiently light emitter (semiconductor optical amplifier) on a silicon substrate is attracting attention. In this laser element, the oscillation mode is controlled by a silicon waveguide filter that is optically connected to the InP light emitter.

[Patent Document 1] Japanese Laid-open Patent Publication No. 2006-245344

[Patent Document 2] Japanese Laid-open Patent Publication No. 2009-200091

SUMMARY

An example of an external resonator-type semiconductor laser element is described. A first-stage ring resonator is connected to an optical waveguide into which the output light from the semiconductor optical amplifier has been introduced. A second-stage ring resonator is connected to the drop port of the first-stage ring resonator, with a totally reflecting mirror placed at the drop port of the second-stage ring resonator. Optical waveguides, ring resonators, and the like are formed on a silicon substrate. In this configuration, light is taken out from the other terminal face of the semiconductor optical amplifier than the one connected to the optical waveguide. This makes it necessary to adjust the optical axes of the optical circuit formed on the silicon substrate and the semiconductor optical amplifier.

It is also possible to take out light using the through port of the first or second-stage ring resonator as the output port. In this case, an optical waveguide formed on the silicon substrate constitutes the output port, and this makes it easy to connect the output port to the rest of the integrated optical circuit as they are formed on the same substrate. However, since a ring resonator is placed between the semiconductor optical amplifier and the output port, the output light is affected by the loss in the ring resonator. For this reason, this configuration is not suited to the pursuit of a high output.

An external resonator-type semiconductor laser element may also be configured by returning the light from the drop port of the second-stage ring resonator to the semiconductor optical amplifier. In this configuration, light must be taken out from a terminal face of the semiconductor optical amplifier. This makes it necessary to adjust the optical axes of the optical circuit formed on the silicon substrate and the semiconductor optical amplifier.

An external resonator-type semiconductor laser element, according to one embodiment explained below, comprising:
an optical amplifier;
a ring resonator optically connected to the optical amplifier;
a first and second reflector constituting an optical resonator that contains the ring resonator and optical amplifier within its optical path;
an output optical waveguide; and
an optical coupler that branches part of the light conducting from the optical amplifier to the ring resonator within the optical resonator off to the output optical waveguide.

An optical element, according to another embodiment explained below, comprising:
an optical coupler comprising an input port, output port, and coupling port;
an input-side optical waveguide connected to the input port of the optical coupler;
a ring resonator comprising an input port and drop port, the input port being connected to the output port of the optical coupler;
a reflector that reflects the light output to the drop port of the ring resonator and re-inputs it to the ring resonator; and
an output optical waveguide connected to the output port of the optical coupler.

A high output may be obtained by branching off part of the light conducting inside the optical resonator by introducing an optical coupler.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Embodiment 1

Figure 1A:
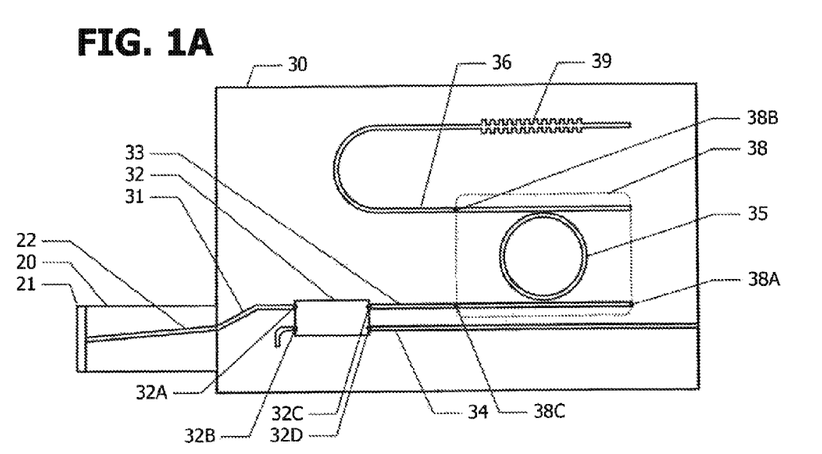
FIG. 1A is a plan view of the external resonator-type laser element in Embodiment 1.

FIG. 1A is a plan view of the external resonator-type semiconductor laser element in Embodiment 1. The external resonator-type semiconductor laser element comprises a semiconductor optical amplifier 20 and an optical circuit 30.

As the semiconductor optical amplifier 20, an InP-based optical amplifier may, for instance, be used. An InP-based semiconductor optical amplifier 20 is designed to have a maximum gain in the neighborhood of 1.55 μm. An optical circuit 30 is connected to one of the terminal faces (outgoing terminal face) of the semiconductor optical amplifier 20, while a high-reflective film 21 is formed over the other terminal face (reflective terminal face). The optical waveguide 22 inside the semiconductor optical amplifier 20 is oblique to the outgoing terminal face by 7° as measured from the normal line towards the substrate in-plane direction. Making the optical waveguide 22 oblique to the outgoing terminal face minimizes the proportion of the light reflected off the outgoing terminal face heading back into the optical waveguide 22.

The optical circuit 30 may, for instance, have a silicon rib waveguide structure formed over a silicon oxide film formed over a silicon substrate. The light output from the outgoing terminal face of the semiconductor optical amplifier 20 is introduced into the input-side optical waveguide 31 of the optical circuit 30. The semiconductor optical amplifier 20 and the optical circuit 30 may, for instance, be connected via a matching gel. The input-side optical waveguide 31 is oblique to the terminal face of the substrate for the optical circuit 30 by 15° as measured from the normal line towards the substrate in-plane direction. The difference between the inclination angle of the optical waveguide 22 inside the semiconductor optical amplifier 20 and the inclination angle of the input-side optical waveguide 31 as part of the optical circuit 30 is based on the difference in effect refractive index between the two.

The input-side optical waveguide 31 is connected to the input port 32A of a two-input two-output optical coupler 32. As well as an input port 32A, the optical coupler 32 also has an isolation port 32B, output port 32C and coupling port 32D. A first optical waveguide 33 is connected to the output port 32C, while an output optical waveguide 34 is connected to the coupling port 32D.

Figure 1B:
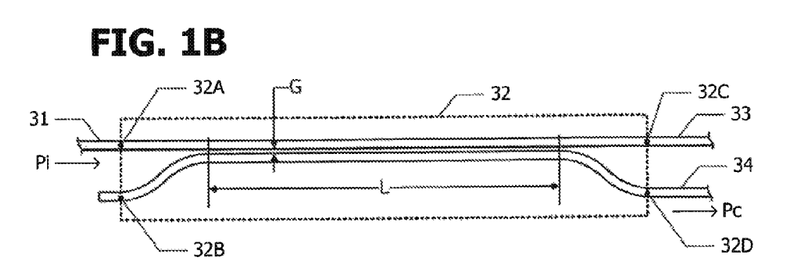
FIG. 1B is a plan view of the optical coupler used in Embodiment 1.
Figure 1C:
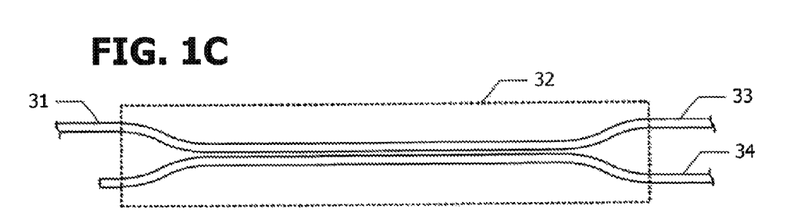
FIG. 1C is a plan view illustrating another configuration of an optical coupler.

FIG. 1B is a plan view of the optical coupler 32. As the optical coupler 32, a directional coupler configured from two optical waveguides placed side by side in close proximity may, for instance, be used. One of the optical waveguides, which has a more or less straight line shape, connects the input port 32A and the output port 32C. The other optical waveguide connects the isolation port 32B and the coupling port 32D. Although, as illustrated in FIG. 1B, the optical waveguide connecting the input port 32A and the output port 32C has a straight line shape in contrast to the partially bent shape that the optical waveguide connecting the isolation port 32B and the coupling port 32D has, both optical waveguides may have a partially bent shape as illustrated in FIG. 1C.

Part of the light input to the input port 32A is output to the output port 32C, and the rest is output to the coupling port 32D. Where Pi is the power of the light input to the input port 32A, Pc is the power of the light output to the coupling port 32D, and K is the coupling coefficient of the optical coupler 32, K is defined as K=Pc/Pi. By changing the spacing G of the optical waveguides inside the directional coupler 32 and coupling length L, the desired coupling coefficient K can be realized.

Part of the light input to the output port 32C returns to the input port 32A, and the rest is output to the isolation port 32B.

As the optical coupler 32, a two-input two-output multi-mode interference (MMI) optical coupler may be used, instead of a directional coupler.

The description continues by going back to FIG. 1A. A ring-shaped optical waveguide 35 is optically connected to the first optical waveguide 33. To the ring-shaped optical waveguide 35, a second optical waveguide 36 is further optically connected. This gives rise to a ring resonator 38 in which the first optical waveguide 33 and second optical waveguide 36 constitute the input-side optical waveguide and output-side optical waveguide, respectively.

The input port 38C of the ring resonator 38 is connected to the output port 32C of the optical coupler 32. The through port 38A of the ring resonator 38 is terminated with, for instance, some light absorption material. To the drop port 38B of the ring resonator 38, a distributed Bragg reflector (DBR) 39 is connected. The distributed Bragg reflector 39 lets part of the light output to the drop port 38B re-enter the ring resonator 38. Although FIG. 1A shows a circular ring-shaped optical waveguide 35, a race track shape may instead be used.

The high-reflective film 21 formed over a terminal face of the semiconductor optical amplifier 20 and the distributed Bragg reflector 39 form a Fabry-Perot optical resonator as a pair of reflectors. The optical path of this optical resonator contains a semiconductor optical amplifier 20, optical coupler 32, and ring resonator 38. If the condition that the gain of the semiconductor optical amplifier 20 is greater than the combined loss generated in the optical coupler 32, ring resonator 38, distributed Bragg reflector 39, and the like, a laser oscillation takes place.

Part of the light undergoing a laser oscillation is led to the output optical waveguide 34 via the optical coupler 32. The light conducting through the output optical waveguide 34 is taken outside the optical circuit 30 as the output. If a second-stage optical element is formed on the same substrate as the optical circuit 30, the light conducting through the output optical waveguide 34 is input to the second-stage optical element. Since the optical circuit 30 and second-stage optical element are formed on the same substrate, the optical circuit 30 and the second-stage optical element can be easily connected without carrying out an optical axis adjustment, etc.

Figure 2A:
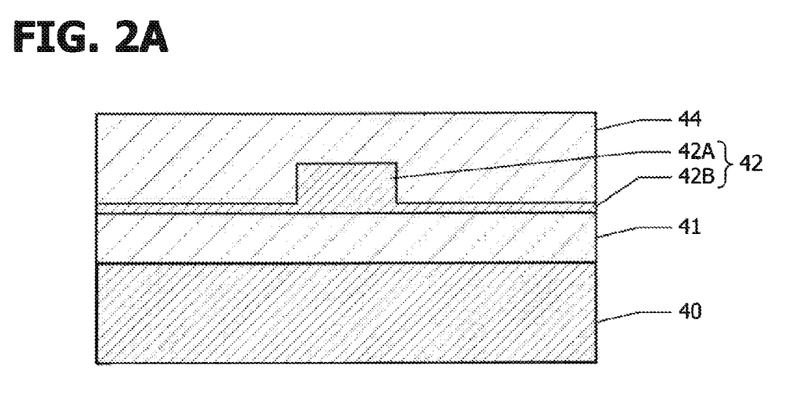
FIG. 2A is a cross-sectional view of each optical waveguide forming part of the optical circuit of the external resonator-type laser element in Embodiment 1.

FIG. 2A is a cross-sectional view of each optical waveguide forming part of the optical circuit 30. An embedded oxide film 41 has been formed over the silicon substrate 40, and a silicon layer 42 has been formed over the embedded oxide film 41. Part of the silicon layer 42 has been processed into a 250 nm-high core layer 42A, with the rest becoming a 50 nm-thick slab layer 42B. From the core layer 42A, the input-side optical waveguide 31, optical coupler 32, first optical waveguide 33, output optical waveguide 34, ring-shaped waveguide 35, second optical waveguide 36 and distributed Bragg reflector 39, as illustrated in FIG. 1A, are assembled. The core layer 42A to be shaped into the input-side optical waveguide 31, optical waveguide inside the optical coupler 32, first optical waveguide 33, output optical waveguide 34, ring-shaped waveguide 35, and second optical waveguide 36 is 500 nm wide.

A clad layer 44, made of silicon oxide, etc., has been formed over the core layer 42A and slab layer 42B.

The production method for the optical circuit 30 is now described. First, an SOI wafer on which the silicon substrate 40, embedded oxide film 41 and silicon layer 42 have been formed is provided. Prior to processing, the thickness of the silicon layer 42 is 0.25 µm. Using a common photolithography process, the silicon layer 42, excluding the region earmarked to become the core layer 42A, is etched off. The etching depth is 0.2 µm. For the etching of the silicon layer 42, reactive ion etching may, for instance, be applied. In this manner, a core layer 42A and slab layer 42B are formed. In this regard, the electron beam exposure process may be employed in place of photolithography. For the formation of the clad layer 44, vacuum deposition may, for instance, be adopted.

Figure 2B:
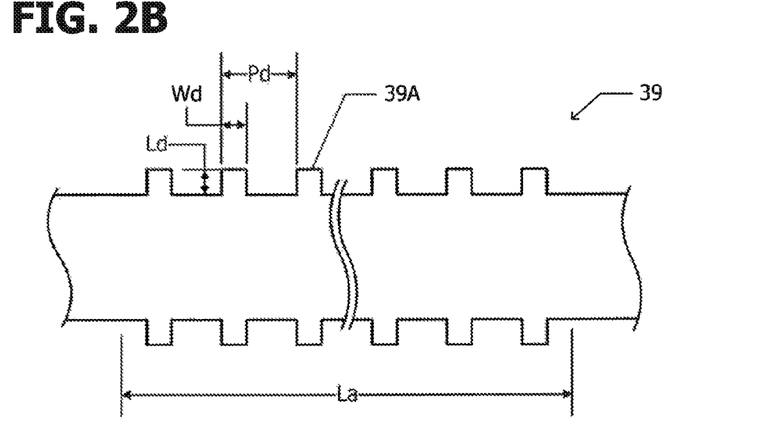
FIG. 2B is a plan view of a distributed Bragg reflector.

FIG. 2B is a plan view of the distributed Bragg reflector 39. A diffraction grating is formed from projections 39A that protrude from the side faces of a 500 nm constant-width optical waveguide. To reflect 1.55 µm-band light, the pitch of the diffraction grating, Pd, may, for instance, be set to 300 nm. The width of a projection 39A (length in the light conducting direction), Wd, may, for instance, be 30 nm to 150 nm. The length of a projection 39A, Ld, may, for instance, be 100 nm. The number of recurring units in the diffraction grating, N, may, for instance, be 200. In that case, the length of the distributed Bragg reflector 39, La, is 60 µm.

Figure 3A:
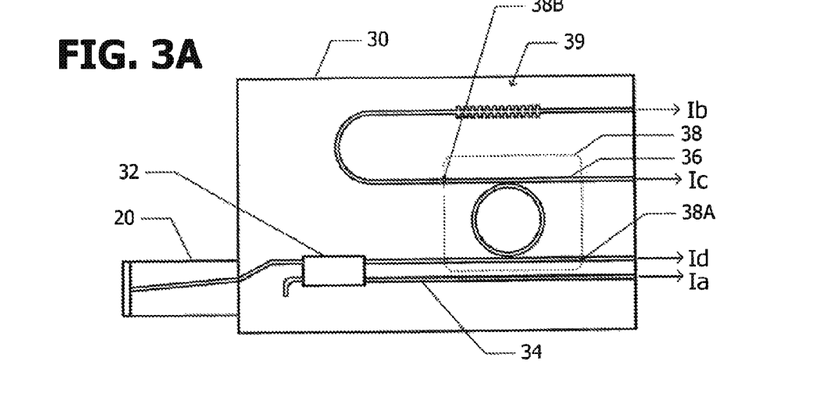
FIG. 3A is a plan view of the external resonator-type laser element in Embodiment 1.

By referring to FIGS. 3A to 3E, the intensities of lights exiting the optical circuit 30 of the external resonator-type laser element under Embodiment 1 from various endpoints of optical waveguides are described. FIG. 3A is a plan view of the specimen used in the measurement of light intensities. The difference between FIG. 3A and FIG. 1A is now described. With the specimen illustrated in FIG. 3A, the through port 38A of the ring resonator 38 is extended to an edge of the substrate for the optical circuit 30. Similarly, the optical waveguide featuring the drop port 38B is extended in the opposite direction to the port right to the edge of the substrate. Further, the optical waveguide continuing on from the far end of the distributed Bragg reflector 39 is extended to the edge of the substrate. The rest of the configuration is identical to the external resonator-type laser element illustrated in FIG. 1A.

Figure 3B:
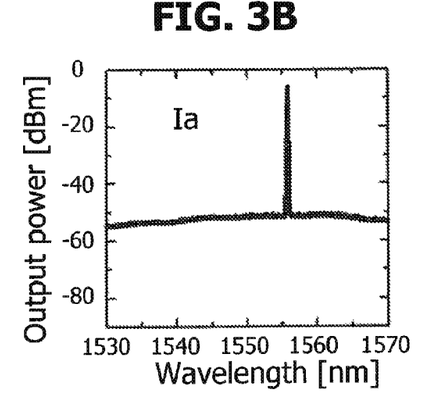
FIGS. 3B to 3E are graphs showing the spectra of lights exiting various optical waveguides of an external resonator-type laser element from various points.
Figure 3C:
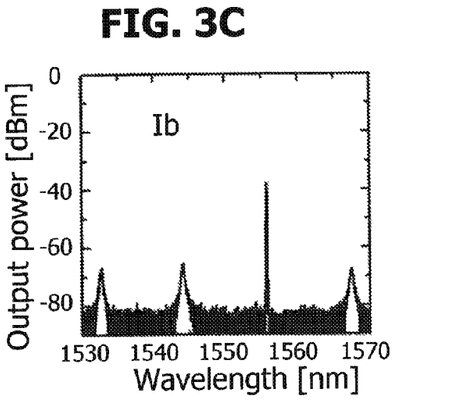
Figure 3D:
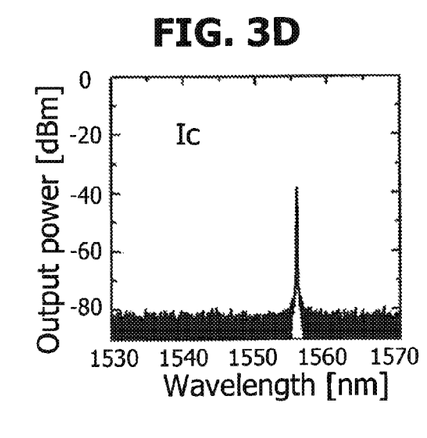
Figure 3E:
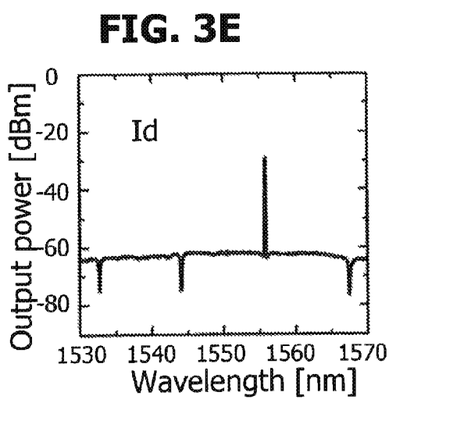

FIG. 3B illustrates the spectrum Ia of the light output from the exit of the output waveguide 34. FIG. 3C illustrates the spectrum Ib of the light that has conducted past the distributed Bragg reflector 39. FIG. 3D illustrates the spectrum Ic of the light exiting the second optical waveguide 36 of the ring resonator 38 from the edge of the substrate located opposite to the drop port 38. FIG. 3E illustrates the spectrum Id of the light output from the through port 38A of the ring resonator 38.

The ring resonator 38 produces two or more resonant modes. The free spectral range (FSR) of the ring resonator 38 was about 12 nm. A single mode is selected from such two or more resonant modes by the distributed Bragg reflector 39. The coupling coefficient K of the optical coupler 32 in the 1.55 µm band was set to about 0.5. The input electric current to the semiconductor optical amplifier 20 was set to 1.2 times the oscillation threshold.

The spectra Ib and Id illustrated, respectively, in FIG. 3C and FIG. 3E exhibit peaks corresponding to two or more resonant modes. It can be seen that, from such two or more resonant modes, the resonant mode located at a wavelength of about 1555 nm is selected. The spectra Ia and Ic illustrated, respectively, in FIG. 3B and FIG. 3D only exhibit the peak that corresponds to the selected 1555-nm resonant mode It can be seen that the peak power of the spectrum Ia is higher than the peak powers of all other spectra, Ib, Ic and Id, by some 30 dB. In particular, the spectrum Ia provides a mode suppression ratio of some 40 dB. Thus, it can be seen that the configuration in which part of the light that has undergone a laser oscillation in the optical resonator is branched off and taken outside via an optical coupler 32 is effective in obtaining a high power output.

In Embodiment 1, an optical coupler 32 is placed midway between the semiconductor optical amplifier 20 and the ring resonator 38. This makes it possible to take out a high intensity light as amplified by the semiconductor optical amplifier 20 without allowing it to be diminished by the loss generated in the ring resonator 38. To obtain a high power output, therefore, it is preferable that part of the light conducting from the semiconductor optical amplifier 20 to the ring resonator 38 be branched off via an optical coupler 32.

Figure 4A:
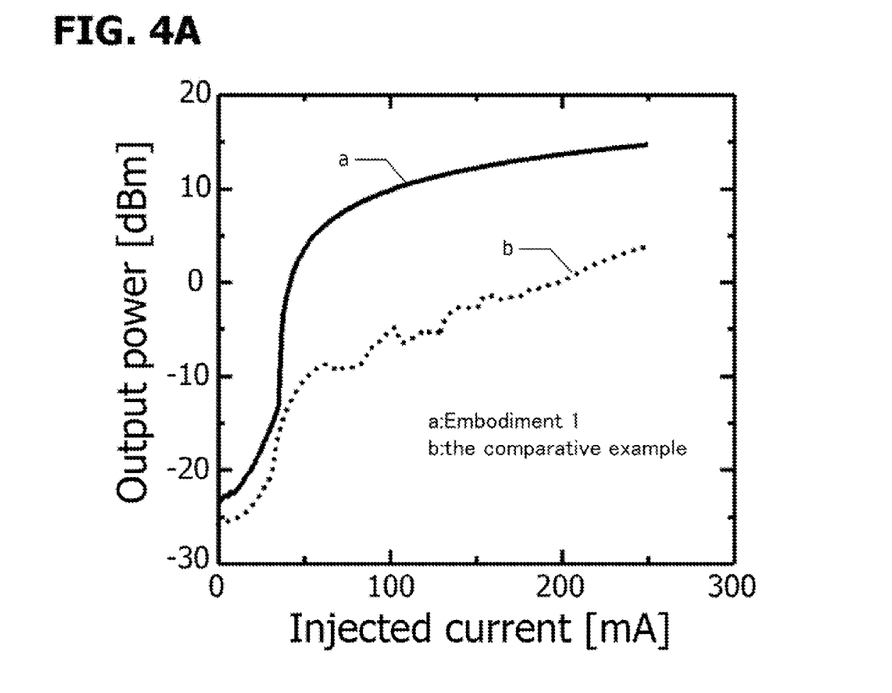
FIG. 4A shows graphs illustrating the relationship between input electric current and output power for external resonator-type laser elements in Embodiment 1 and the comparative example.

FIG. 4A illustrates the relationship between the input electric current and output power of the external resonator-type laser element in Embodiment 1 in comparison with the external resonator-type laser element in the comparative example. The horizontal axis represents input electric current in units of mA, while the vertical axis represents output power in units of dBm.

Figure 4B:
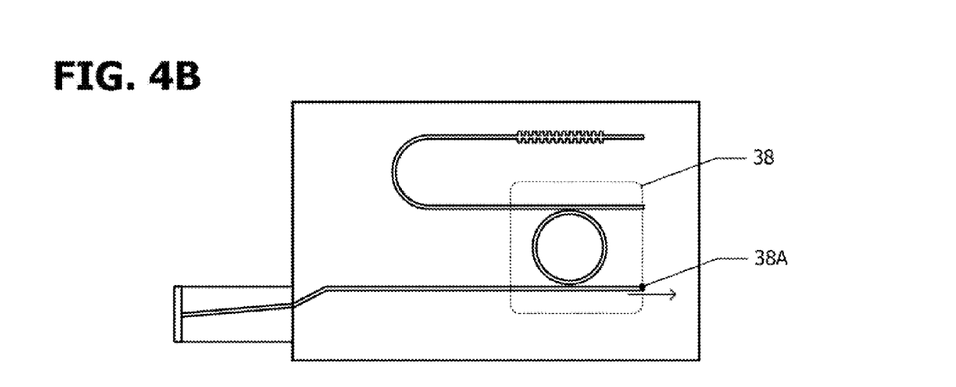
FIG. 4B is a plan view of the external resonator-type laser element in the comparative example.

FIG. 4B illustrates a plan view of the external resonator-type laser element in the comparative example. The external resonator-type laser element in the comparative example has a configuration obtained by removing the optical coupler 32 and output optical waveguide 34 from the external resonator-type laser element in Embodiment 1, as illustrated in FIG. 1A. With the external resonator-type laser element in the comparative example, the power of the light output from the through port 38A of the ring resonator 38 was measured.

The solid line a and dotted line b in FIG. 4A represent the output characteristics of the external resonator-type laser element under Embodiment 1 and the comparative example, respectively. The output power of the external resonator-type laser element of Embodiment 1 is greater than the output power of the external resonator-type laser element of the comparative example over the whole range of input electric current. From this, it can be seen that accessing the output via an optical coupler 32 in Embodiment 1 makes it possible to obtain a high output.

Next, the relationship between the gain spectrum of the semiconductor optical amplifier 20 and the wavelength dependence of the coupling coefficient K of the optical coupler 32 is described by referring to FIGS. 5 to 8.

Figure 5:
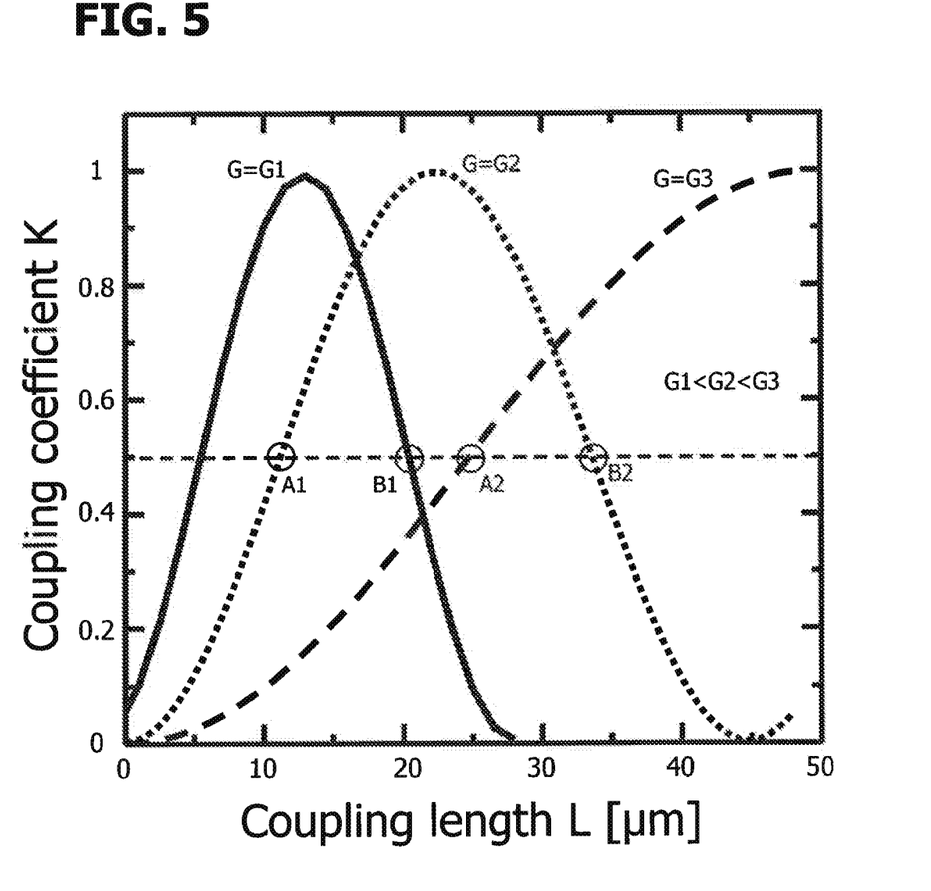
FIG. 5 shows graphs illustrating the relationship between the coupling coefficient and coupling length of an optical coupler for selected values of optical waveguide spacing.

FIG. 5 illustrates the relationship between the coupling length L of the optical coupler 32 (FIG. 1B) and the coupling coefficient K. The horizontal axis represents the coupling length L in units of μm, while the vertical axis represents the coupling coefficient K. The solid line, dotted line and dashed line in FIG. 5 represent the coupling coefficient K when the spacing G of the waveguides inside the optical coupler 32 (FIG. 1B) is G1, G2 and G3, respectively. Here, G1<G2<G3. The wavelength of the conducting light was 1.55 μm.

As the coupling length L increases from 0, the coupling coefficient K increases until it reaches a maximum at a certain value of coupling length L. After that, as the coupling length L increases, the coupling coefficient K decreases until it reaches a minimum at a certain value of coupling length L. In this manner, the coupling coefficient K alternates between increasing and decreasing as the coupling length L increases. By adjusting the coupling length L and waveguide spacing G of the optical coupler 32, the coupling coefficient K of the optical coupler 32 can be changed from 0 to 1.

To realize the same coupling coefficient K, various combinations of coupling length L and waveguide spacing G can be adopted. If coupling coefficient K needs to be set to 0.5, for instance, any of the combinations of coupling length L and waveguide spacing G represented by operating points A1, B1, A2, B2, etc. as illustrated in FIG. 5 may be used.

Figure 6:
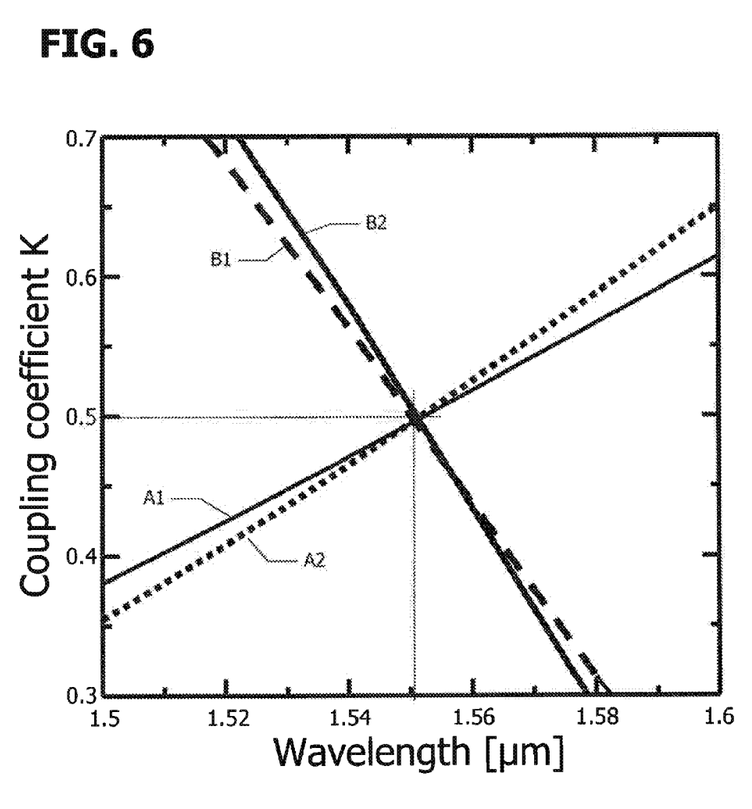
FIG. 6 shows graphs illustrating the wavelength dependence of the coupling coefficient of an optical coupler.

FIG. 6 illustrates the wavelength dependence of coupling coefficient K. The horizontal axis represents wavelength in units of μm, while the vertical axis represents coupling coefficient K. The thin solid line A1, dotted line A2, dashed line B1 and thick solid line B2 in FIG. 6 represent coupling coefficient K as it changes with wavelength during operation at operating points A1, A2, B1 and B2, respectively, in FIG. 5. With an optical coupler 32 operating at operating point A1 or A2, the slope of the graph illustrating the wavelength dependence of coupling coefficient K is positive. In contrast, with an optical coupler 32 operating at operating point B1 or B2, the slope of the graph illustrating the wavelength dependence of coupling coefficient K is negative. Thus, the slope of the graph illustrating the wavelength dependence of coupling coefficient K may be set either positive or negative.

Figure 7:
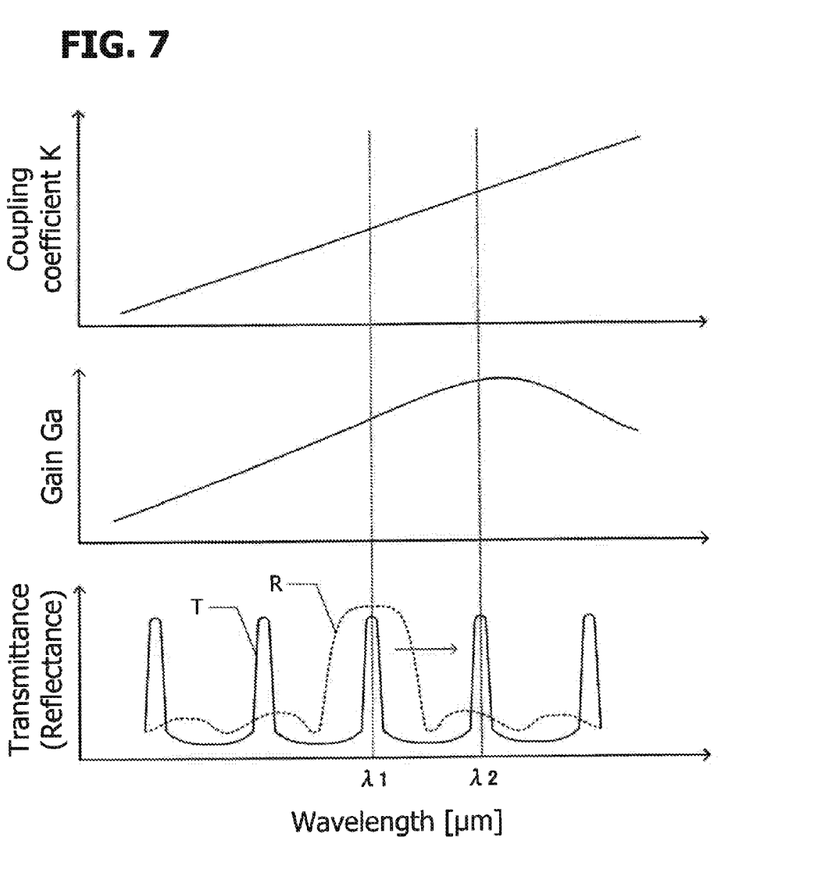
FIG. 7 shows graphs illustrating an example of the relationship between the wavelength dependence of the coupling coefficient of an optical coupler, gain spectrum of a semiconductor optical amplifier, transmission spectrum of a ring resonator and reflection spectrum of a distributed Bragg reflector.

FIG. 7 shows a set of example graphs of the wavelength dependence of the coupling coefficient K of an optical coupler 32, gain spectrum Ga of a semiconductor optical amplifier 20, transmission spectrum T of a ring resonator 38, and reflection spectrum R of a distributed Bragg reflector 39. The transmission spectrum T of a ring resonator 38 exhibits two or more peaks at constant intervals called the "free spectral range" (FSR). The reflection spectrum R of a distributed Bragg reflector 39 displays a high reflectance over a certain wavelength band, accompanied by a series of side bands on both sides.

Normally, a laser oscillation occurs at wavelength $\lambda 1$, which both corresponds to a peak transmission spectrum T and falls within the pass band of the reflection spectrum R. The semiconductor optical amplifier 20 is designed to have a maximum gain at wavelength $\lambda 1$. However, as illustrated in FIG. 7, the maximum gain of the semiconductor optical amplifier 20 sometimes occurs at a longer wavelength than wavelength $\lambda 1$ due to production variability. In that event, a mode hopping from the peak at wavelength $\lambda 1$ in the transmission spectrum T to its adjacent peak on the longer wavelength side, i.e. at wavelength $\lambda 2$, is more likely to occur.

In the example illustrated in FIG. 7, an optical circuit 30 designed to make the slope of the graph showing the wavelength dependence of the coupling coefficient K of the optical coupler 32 positive is combined with a semiconductor optical amplifier 20. As the coupling coefficient K increases, the loss in the Fabry-Perot optical resonator increases, and this diminishes the likelihood of a laser oscillation. Namely, a mode hopping towards the longer wavelength side is less likely to occur.

As described above, by taking advantage of the wavelength dependence of coupling coefficient K of the optical coupler 32, a mode hopping towards the longer wavelength side as attributable to the gain spectrum Ga of the semiconductor optical amplifier 20 may be suppressed.

Figure 8:
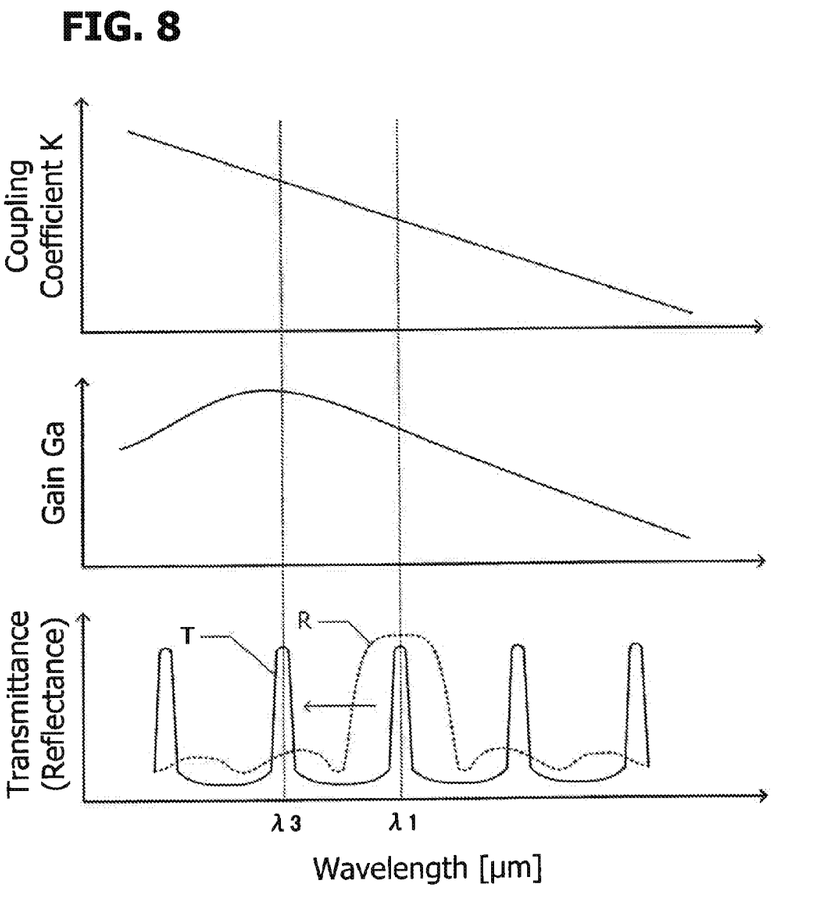
FIG. 8 shows graphs illustrating another example of the relationship between the wavelength dependence of the coupling coefficient of an optical coupler, gain spectrum of a semiconductor optical amplifier, transmission spectrum of a ring resonator and reflection spectrum of a distributed Bragg reflector.

FIG. 8 shows another set of example graphs of the wavelength dependence of the coupling coefficient K of an optical coupler 32, gain spectrum Ga of a semiconductor optical amplifier 20, transmission spectrum T of a ring resonator 38, and reflection spectrum R of a distributed Bragg reflector 39. In the example illustrated in FIG. 8, the gain spectrum Ga of the semiconductor optical amplifier 20 displays the maximum value near wavelength $\lambda 3$, which is on the shorter side of the target oscillation wavelength $\lambda 1$. In this case, an optical circuit 30 designed to make the slope of the graph showing the wavelength dependence of the coupling coefficient K of the optical coupler 32 negative is combined with a semiconductor optical amplifier 20. This makes it possible to suppress the mode hopping towards the shorter wavelength side as attributable to the gain spectrum Ga of the semiconductor optical amplifier 20.

Although Embodiment 1 used a configuration designed to output light belonging to the 1.55 μm band, it is also possible to configure a laser element that outputs light from another wavelength band by changing the material of the semiconductor optical amplifier 20 and the dimensions of the optical element.

Embodiment 2

Figure 9:
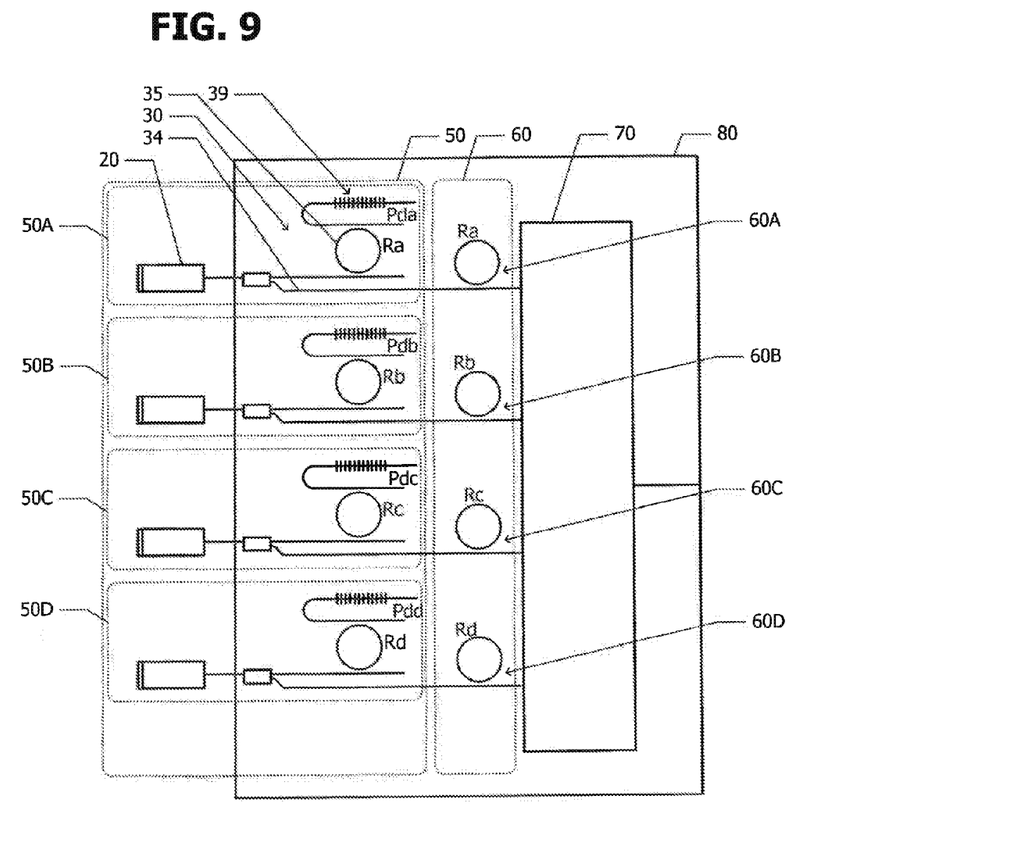
FIG. 9 is a plan view of the optical element in Embodiment 2.

FIG. 9 is a plan view of the optical element in Embodiment 2. The optical element in Embodiment 2 comprises a laser section 50, modulation section 60, and multiplexing section 70. The laser section 50 comprises four external resonator-type laser elements, 50A, 50B, 50C and 50D. Each of external resonator-type laser elements 50A, 50B, 50C and 50D has an identical configuration to the external resonator-type laser element in Embodiment 1, as illustrated in FIG. 1A, with only dimensional differences. More specifically, each of external resonator-type laser elements 50A, 50B, 50C and 50D comprises a semiconductor optical amplifier 20 and an optical circuit 30. The optical circuits 30 of the four external resonator-type laser elements, 50A, 50B, 50C and 50D, are formed on the same substrate 80.

Radii Ra, Rb, Rc and Rd of the ring-shaped waveguides 35 in external resonator-type laser elements 50A, 50B, 50C and 50D, respectively, differ from one another, and so are diffraction grating pitches Pda, Pdb, Pdc and Pdd of the distributed Bragg reflectors 39. When realizing four waves with frequency intervals of 200 GHz, for instance, Ra=8 μm, as well as Rb=Ra−δR, Rc=Rb−δR and Rd=Rc−δR, should hold, where δR is about 8 nm. In addition, Pda=300.6 nm, as well as Pdb=Pda−δPd, Pdc=Pdb−δPd and Pdd=Pdc−δPd, should hold, where δPd is about 0.311 nm. The coupling coefficient of a distributed Bragg reflector 39 should be about 150 cm−1, while the length La of its diffraction grating (FIG. 2B) should be about 120 μm.

If it is desired to change the frequency interval of the four waves output from the four external resonator-type laser elements, 50A, 50B, 50C and 50D, changes just need to be made to δR and δPd. In the case of obtaining a frequency interval of, for instance, 400 GHz, it suffices to set δR and δPd to about 16 nm and 0.622 nm.

The modulation section 60 comprises four modulators, 60A, 60B, 60C and 60D. Modulators 60A, 60B, 60C and 60D are connected to the output optical waveguides 34 of external resonator-type laser elements 50A, 50B, 50C and 50D, respectively.

Each of modulators 60A, 60B, 60C and 60D comprises an all-pass ring resonator. On the core layer 42A (FIG. 2A) of the all-pass ring resonator, electrodes are formed. By applying a voltage to the electrodes and thus changing the refractive index of the core layer 42A, the block bands of modulators 60A, 60B, 60C and 60D can be changed.

The radii of the ring resonators of modulators 60A, 60B, 60C and 60D are the same as radii Ra, Rb, Rc and Rd of the ring-shaped waveguides 35 of external resonator-type laser elements 50A, 50B, 50C and 50D, respectively. For this reason, the operating wavelengths of modulators 60A, 60B, 60C and 60D are synchronized with the oscillation wavelengths of external resonator-type laser elements 50A, 50B, 50C and 50D, respectively. Here, "operating wavelengths being synchronized with oscillation wavelengths" means that modulators 60A, 60B, 60C and 60D have the control over the passing or blocking of the lights with the oscillation wavelengths of external resonator-type laser elements 50A, 50B, 50C and 50D, respectively.

Modulators 60A, 60B, 60C and 60D are formed on the same substrate 80 as the optical circuit 30, which features external resonator-type laser elements 50A, 50B, 50C and 50D.

The multiplexing section 70 may be configured from, for instance, an arrayed waveguide grating (AWG) multiplexer. The signal beams modulated by modulators 60A, 60B, 60C and 60D are input to the four input ports of the AWG multiplexer. The AWG multiplexer multiplexes the four input waves and outputs the resulting beam from its output port.

The optical element in Embodiment 2 may be used as a transmitter that multiplexes four signal beams with different wavelengths and outputs the resulting beam.

The effect of the configuration in which the ring-shaped waveguides 35 of external resonator-type laser elements 50A, 50B, 50C and 50D and the all-pass ring resonators of modulators 60A, 60B, 60C and 60D are formed on the same substrate 80 is now described.

Figure 10:
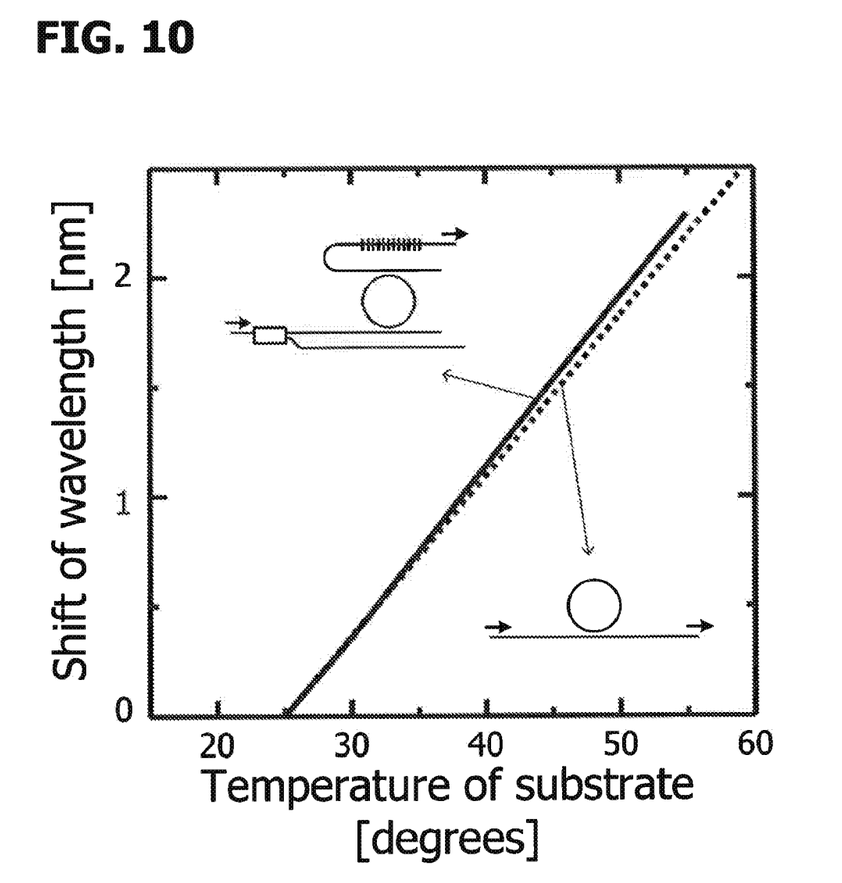
FIG. 10 shows graphs illustrating the temperature dependence of the resonant wavelength of an external resonator-type laser element and that of the operating wavelength of an all-pass ring modulator.

FIG. 10 shows measurement results for the temperature dependence of the resonant wavelength of the external resonator-type laser element in Embodiment 1 and operating wavelength of the all-pass ring modulator. The horizontal axis represents substrate temperature in ° C., while the vertical axis represents the sizes of shift in wavelength from the resonant wavelength and operating wavelength when the substrate temperature is 25° C. in units of nm.

The solid line and dashed line in FIG. 10 represent, respectively, the size of wavelength shift in the resonant wavelength of the external resonator-type laser element in Embodiment 1 and the size of wavelength shift in the operating wavelength of the all-pass ring modulator. In this regard, the resonant wavelength of the external resonator-type laser element was obtained from the spectrum of the light detected after the distributed Bragg reflector 39 when white light was input from the input-side optical waveguide. The operating wavelength of the all-pass ring modulator was obtained from the transmission spectrum when white light was input.

The size of wavelength shift in the resonant wavelength of the external resonator-type laser element was 0.076 nm/° C., while the size of wavelength shift in the operating wavelength of the all-pass ring modulator was 0.073 nm/° C. This shows that the difference between the two is very small. For this reason, even if substrate temperature changes, the synchronization between the resonant wavelength of the external resonator-type laser element and the operating wavelength of the all-pass ring modulator can be maintained.

Although Embodiment 2 illustrates an optical element that multiplexes four signal beams, the number of signal beams is not limited to four. A configuration designed to multiplex two or three signal beams, or even one designed to multiplex five or more signal beams, may also be employed.

Embodiment 3

Figure 11:
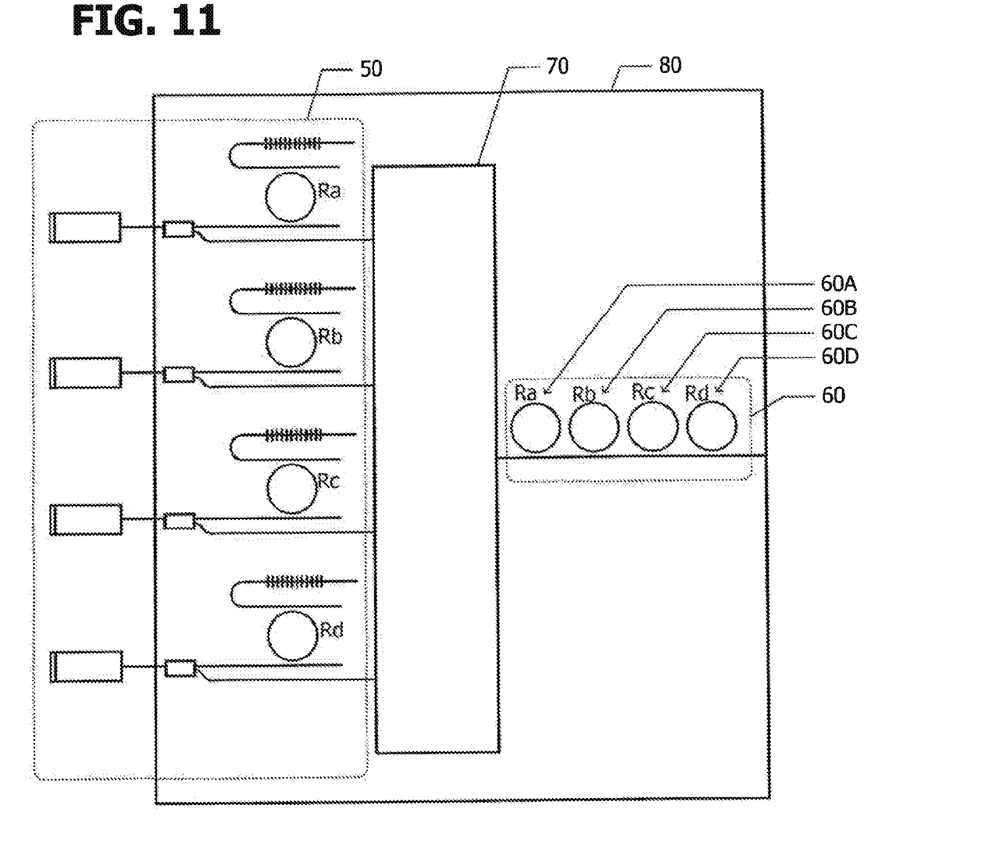
FIG. 11 is a plan view of the optical element of Embodiment 3.

FIG. 11 is a plan view of the optical element in Embodiment 3. In the description below, only the differences from Embodiment 2 are addressed, with any identical aspects of the configuration omitted. In Embodiment 2, the output lights from the laser section 50 were modulated in the modulation section 60 and then multiplexed in the multiplexing section 70. In Embodiment 3, the output lights from the laser section 50 are first multiplexed in the multiplexing section 70. After multiplexing, the output light is modulated in the modulation section 60.

The configurations of the laser section 50 and multiplexing section 70 are identical to the configurations of the laser section 50 and multiplexing section 70 of the optical element in Embodiment 2. The modulation section 60 comprises four cascade-connected all-pass ring modulators, 60A, 60B, 60C and 60D. The radii of all-pass ring modulators 60A, 60B, 60C and 60D are the same as the radii of the ring-shaped waveguides 35 of external resonator-type laser elements 50A, 50B, 50C and 50D, i.e. Ra, Rb, Rc and Rd, respectively.

As with the case of Embodiment 2, the optical element in Embodiment 3 may also be used as a transmitter that multiplexes four signal beams with different wavelengths and outputs the resulting beam.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

The invention claimed is:

1. An external resonator-type semiconductor laser element, comprising:
    an optical amplifier;
    a ring resonator optically connected to the optical amplifier;
    a first and second reflector constituting an optical resonator that contains the ring resonator and optical amplifier within its optical path;
    an output optical waveguide; and
    an optical coupler that branches part of a light conducting from the optical amplifier to the ring resonator within the optical resonator off to the output optical waveguide.

2. An external resonator-type semiconductor laser element as described in claim 1, wherein the second reflector is placed at a position where the reflection of the light output from the drop port of the ring resonator can occur and comprises a distributed Bragg reflector.

3. An external resonator-type semiconductor laser element as described in claim 2, wherein:
   the optical coupler is a directional coupler whose coupling coefficient has a wavelength dependence;
   the optical amplifier has a maximum gain at a longer wavelength than the resonant wavelength determined by the ring resonator and second reflector; and
   the optical coupler has a characteristic such that its coupling coefficient increases as the wavelength lengthens past the resonant wavelength.

4. An external resonator-type semiconductor laser element as described in claim 2, wherein:
   the optical coupler is a directional coupler whose coupling coefficient has a wavelength dependence;
   the optical amplifier has a maximum gain at a shorter wavelength than the resonant wavelength determined by the ring resonator and second reflector; and
   the optical coupler has a characteristic such that its coupling coefficient increases as the wavelength shortens past the resonant wavelength.

5. An external resonator-type semiconductor laser element as described in claim 1, wherein the ring resonator, optical coupler, second reflector and output optical waveguide are disposed on the same substrate.

6. An external resonator-type semiconductor laser element described in claim 5, further comprising a ring modulator disposed on the substrate and connected to the output optical waveguide, wherein the operating wavelength of the ring modulator is synchronized with the resonant wavelength of the ring resonator.

* * * * *